United States Patent
Sorimachi et al.

(10) Patent No.: US 8,442,085 B2
(45) Date of Patent: May 14, 2013

(54) SEMICONDUCTOR OPTICAL DEVICE

(75) Inventors: Susumu Sorimachi, Komoro (JP); Yutaka Inoue, Komoro (JP); Yasuhisa Semba, Saku (JP)

(73) Assignee: Oclaro Japan, Inc., Yokohama-shi (JP)

( * ) Notice: Subject to any disclaimer, the term of this patent is extended or adjusted under 35 U.S.C. 154(b) by 3 days.

(21) Appl. No.: 12/948,794

(22) Filed: Nov. 18, 2010

(65) Prior Publication Data

US 2011/0116526 A1    May 19, 2011

(30) Foreign Application Priority Data

Nov. 19, 2009 (JP) ................ 2009-264062

(51) Int. Cl.
*H01S 5/00* (2006.01)

(52) U.S. Cl.
USPC ............... 372/46.012; 372/36; 372/43.01

(58) Field of Classification Search ............ 372/46.012
See application file for complete search history.

(56) References Cited

U.S. PATENT DOCUMENTS

| 6,075,800 | A | * | 6/2000 | Spear .................. 372/36 |
| 2002/0105981 | A1 | * | 8/2002 | Gen-ei et al. ............ 372/36 |
| 2004/0252739 | A1 | * | 12/2004 | Takeuchi et al. ........... 372/46 |
| 2008/0036044 | A1 | | 2/2008 | Sakuma et al. |
| 2008/0279246 | A1 | | 11/2008 | Nakatsuka et al. |

FOREIGN PATENT DOCUMENTS

JP    2008-42131 A    2/2008
JP    2008-277471 A    11/2008

\* cited by examiner

*Primary Examiner* — Xinning Niu
(74) *Attorney, Agent, or Firm* — Miles and Stockbridge P.C.

(57) ABSTRACT

By forming upper-bank patterns made of Au with a thickness of 1.5 μm or larger on bank portions, a solder material on a submount and a surface of a conductive layer in an upper part of a ridge portion of a laser chip are separated so as not to be in contact with each other, thereby preventing the stress generated in a bonding portion when bonding the laser chip and the submount from being applied to the ridge portion.

10 Claims, 8 Drawing Sheets

SEMICONDUCTOR OPTICAL DEVICE

CROSS-REFERENCE TO RELATED APPLICATION

The present application claims priority from Japanese Patent Application No. 2009-264062 filed on Nov. 19, 2009, the content of which is hereby incorporated by reference to this application.

TECHNICAL FIELD OF THE INVENTION

The present invention relates to a semiconductor optical device, and more particularly to a technology effectively applied to a semiconductor optical device having a laser diode.

BACKGROUND OF THE INVENTION

A laser diode (semiconductor laser) is a diode in which a forward current is applied to a pn junction and light is emitted by stimulated emission caused by recombination of injected electrons and holes. The laser diode has been widely used mainly for the information industry including the reading and writing of optical disks such as CD and MD, the laser printer and medical and measurement equipment.

There are several types of laser diodes such as a single-beam laser diode (single-beam semiconductor laser) and an array laser diode (array semiconductor laser). The single-beam laser diode is a laser diode device having only one light-emitting portion, and the array laser diode is a laser diode device having plural light-emitting portions. Since the array laser diode can easily increase the number of scanning beams compared with the single-beam laser diode, it is suitable for the laser printer used for high-speed printing. Furthermore, the array laser diode is also called as a multi-beam laser diode.

In recent years, in order to improve the dissipation of the heat generated in a light-emitting portion in a laser diode, a junction-down method in which a main surface side of a laser diode chip having the light-emitting portion is directed to a submount side and bonded to the submount by using solder or the like has been generally used as a bonding method.

Japanese Patent Application Laid-Open Publication No. 2008-42131 (Patent Document 1) discloses a technology for preventing a layer damaged by dry etching from being left on a ridge-shaped waveguide structure positioned in an upper part of a light-emitting portion in a waveguide semiconductor laser. Specifically, a spacer layer and a damage receptive layer are formed on a contact layer in an upper part of a ridge-shaped waveguide structure to make the two layers absorb the damage caused when removing a passivation film in an upper part of the ridge-shaped waveguide structure by dry etching, and then, the spacer layer and the damage receptive layer are selectively removed by wet etching. In this manner, the spacer layer and the damage receptive layer damaged by dry etching are removed, so that the deterioration of the device can be prevented.

Furthermore, in the above-described Patent Document 1, the upper surface of the ridge-shaped waveguide structure becomes lower in height than the upper surface of the damage receptive layer by the spacer layer and the damage receptive layer formed for the purpose of preventing the ridge-shaped waveguide structure from being damaged by dry etching, so that the ridge-shaped waveguide structure is protected from being hurt in the assembly process of the device.

Japanese Patent Application Laid-Open Publication No. 2008-277471 (Patent Document 2) discloses a technology in which, when an array semiconductor laser is assembled while directing a bonding surface downward, only a specific portion of a laser chip is soldered and a stress absorbing portion is formed below a bonding portion, thereby making it difficult to transmit the stress generated due to the difference in thermal expansion coefficient between the laser chip and the submount to the laser chip.

SUMMARY OF THE INVENTION

In the laser diode bonded by the junction-down method, an Au electrode material formed on the ridge portion positioned in the upper part of the light-emitting portion and a conductive solder material (for example, AuSn) formed on the submount are melted and adhered, whereby the heat is dissipated and the electrical conduction is established.

Here, as the problem in the assembly of the laser diode and the submount, the stress generated by the reaction caused due to the difference in thermal expansion coefficient of the electrode material on the ridge portion of the laser diode, the semiconductor material on the main surface of the laser diode, the solder material of the submount and the substrate material of the submount reaches the ridge portion, and the polarization angle characteristics are deteriorated.

The polarization angle characteristics mean the characteristics of the angle of the polarized wave of the light irradiated from the laser diode, and the polarized wave preferably vibrates in the plane along the main surface of the chip of the laser diode. The irradiation of the light whose polarized wave surface is obliquely rotated with respect to the main surface of the chip of the laser diode leads to the deterioration of the polarization angle characteristics, and when the laser diode whose polarization angle characteristics are deteriorated is used, there occurs a problem of the decrease in the amount of light when transmitting through an optical component such as lens.

In the technology disclosed in the Patent Document 2 described above, a stress absorbing portion including voids and soft material is formed below an electrode of the bonding portion with the submount in the array semiconductor laser, thereby reducing the stress generated due to the difference in the thermal expansion coefficient between the laser chip and the submount. However, the process of forming the stress absorbing portion is complicated and has a large number of steps, and further, it has a problem that it is difficult to form a metal film on In (indium) and photoresist due to the relation in the melting point of the members. Also, since the stress absorbing portion including the voids and photoresist exists instead of a material with good heat and electrical conduction such as gold, there is a problem that the electrical conduction from the ridge portion to the submount and the heat conduction when dissipating heat generated in the ridge portion to the submount are insufficient.

Accordingly, the inventors of the present invention have studied the semiconductor optical device in which the ridge portion positioned in an upper part of the light-emitting portion and the solder material on the submount are formed so as not to be in direct contact with each other, thereby making it difficult to transmit the stress to the ridge portion. As the method of preventing the direct contact between the ridge portion and the solder material, the following methods are known, but each of the methods has a problem.

(1) A material (for example, Ti) which is easily oxidized and is hard to react with a solder material is partly formed only in a region of an upper part of the ridge portion on which the electrode is formed. An oxide film is formed by forming the layer oxidized easily, so that the reaction with the solder material is prevented.

In this case, since the width of the ridge portion is about 1.5 µm, when the material which is hard to react with the solder material is formed only on the upper part of the ridge portion, high positional accuracy is required in the photolithography. Furthermore, there is a possibility that the stress variation occurs due to the progress of the reaction between the electrode and the solder material from the periphery of the material which is hard to react with the solder material and formed on the ridge portion.

(2) The pattern layout in which a part of the solder material on the submount at the position to which the ridge portion is to be in contact is separated to achieve a noncontact state is formed.

In the case of the assembly of the submount with this specification, since the position of the upper part of the ridge portion of the laser diode chip has to be aligned with the position separated from the solder material, high positional accuracy is required in the assembly equipment. Note that there is a possibility that the stress variation occurs due to the progress of the partial reaction when the positional misalignment occurs.

(3) The laser diode chip is assembled by the junction-up method to form the ridge portion on the surface reverse to the surface positioned to the solder material.

In this case, the ridge portion is separated from the bonding portion with the solder material and is hard to receive the influence of the generated stress, but the dissipation of the heat generated in the ridge portion is deteriorated and it leads to the characteristic defect and the reduction in lifetime.

An object of the present invention is to provide a technology capable of stabilizing the polarization angle characteristics of the laser diode without losing the electrical conduction and heat dissipation and requiring the high positional accuracy in the process of mounting the laser diode chip on the submount in the semiconductor optical device.

The above and other objects and novel characteristics of the present invention will be apparent from the description of the present specification and the accompanying drawings.

The following is a brief description of an outline of the typical invention disclosed in the present application.

A semiconductor optical device according to an invention of the present application is a semiconductor optical device in which a semiconductor substrate having a laser diode formed thereon is bonded to a submount by a junction-down method. The laser diode includes: a clad layer of a first conductivity type formed on a main surface of the semiconductor substrate; an active layer formed on an upper surface of the clad layer of the first conductivity type; a clad layer of a second conductivity type formed on the active layer; a ridge portion having the clad layer of the second conductivity type; and bank portions each having the clad layer of the second conductivity type and formed on lateral sides of the ridge portion.

Also, the laser diode further includes: a first electrode electrically connected to the ridge portion and continuously formed from an upper part of the ridge portion to upper parts of the bank portions; upper-bank patterns formed in the upper parts of the bank portions; and a second electrode formed on a rear surface of the semiconductor substrate.

Furthermore, in the laser diode, upper surfaces of the bank portions including the first electrode and the upper-bank patterns are bonded to an upper surface of a third electrode formed on the submount, the upper surfaces of the bank portions are higher in height than an upper surface of the first electrode in the upper part of the ridge portion, and the surface of the first electrode in the upper part of the ridge portion is separated from the surface of the third electrode on the submount.

The effects obtained by typical embodiments of the invention disclosed in the present application will be briefly described below.

It is possible to stabilize the polarization angle characteristics without losing the electrical conduction and heat dissipation and requiring the high positional accuracy in the process of mounting the laser diode chip on the submount in the semiconductor laser.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "comprise A" in the embodiments below, elements other than A are not excluded except the case where it is particularly specified that A is the only element thereof.

Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical value and the range described above.

Still further, when the materials and the like are mentioned, the specified material is a main material unless otherwise stated or except the case where it is not so in principle or situationally, and the secondary components, additives, additional components and the like are not excluded. For example, a silicon material includes not only the case of pure silicon but also secondary and ternary alloys (for example, SiGe) and the like formed of additive impurities and silicon as the main component unless otherwise stated.

Also, components having the same function are denoted by the same reference symbols throughout the drawings for describing the embodiments, and the repetitive description thereof will be omitted.

First Embodiment

Figure 1:
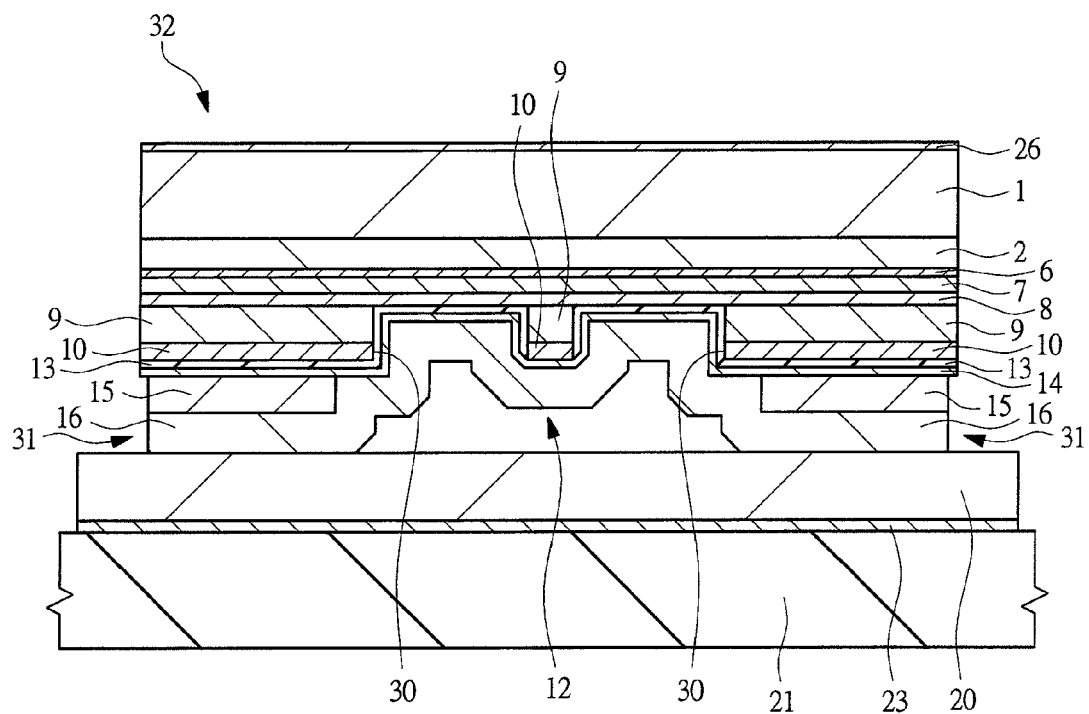
FIG. 1 is a cross-sectional view showing the principal part of the semiconductor optical device according to the first embodiment of the present invention.

FIG. 1 shows a semiconductor optical device according to the present embodiment. In FIG. 1, a laser chip 32 having a main surface and a rear surface reverse to the main surface is formed on a GaAs substrate 1, and the laser chip 32 whose main surface is directed downward is bonded onto a solder material 20 formed on a submount 21 via a wiring pattern 23. Here, since the laser chip 32 is attached to the submount 21 while directing the main surface thereof downward, in the following description with reference to FIG. 1, the components will be described on the assumption that the main surface of the laser chip 32 is directed upward.

Figure 2:
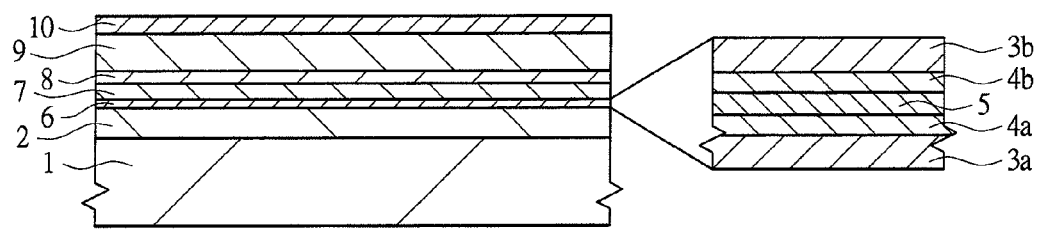
FIG. 2 is a cross-sectional view showing the principal part of the manufacturing method of the semiconductor optical device according to the first embodiment of the present invention.

In FIG. 1, an n-type clad layer 2 is formed on the GaAs substrate 1, and an n-side electrode 26 is formed on the rear surface of the GaAs substrate 1. A multiple quantum well active layer 6 is formed on the n-type clad layer 2, a first p-type clad layer 7 is formed on the multiple quantum well active layer 6, and an etching stop layer 8 is formed on the first p-type clad layer 7. Note that the multiple quantum well active layer 6 includes an optical confinement layer 3a, a strained quantum well layer 4a, a barrier layer 5, a strained quantum well layer 4b and an optical confinement layer 3b as shown in FIG. 2.

Two trenches 30 which reach an upper surface of the etching stop layer 8 are formed in an upper part of the laser chip 32, a ridge portion 12 is formed between the trenches 30, and bank portions 31 are formed on one lateral side of the ridge portion 12 and on the other opposite lateral side so as to sandwich the trenches 30. The ridge portion 12 includes a second p-type clad layer 9 formed on the upper surface of the etching stop layer 8 and a contact layer 10 formed on the second p-type clad layer 9. Furthermore, the bank portion 31 includes the second p-type clad layer 9 formed on the upper surface of the etching stop layer 8, the contact layer 10 formed on the second p-type clad layer 9, an upper-bank pattern 15 formed on the contact layer 10 and a conductive layer 16 formed on the upper-bank pattern 15.

A silicon nitride film 13 is formed on an upper surface of the contact layer 10 of the bunk portion 31 and on an inner wall of the trench 30, and a p-side electrode 14 electrically connected to the contact layer 10 in an upper part of the ridge portion 12 is formed on the upper surface of the contact layer 10 of the ridge portion 12, an upper surface of the silicon nitride film 13 and a side wall of the silicon nitride film 13. Note that, in the present embodiment, the silicon nitride film 13 is formed below the p-side electrode 14 except on the upper surface of the ridge portion 12, but a silicon oxide film may be formed instead of the silicon nitride film 13.

The upper-bank pattern 15 is formed on an upper surface of the p-side electrode 14 in an upper part of the bank portion 31, and the conductive layer 16 is formed on an upper surface and a side surface of the upper-bank pattern 15 and on the upper surface and a side surface of the p-side electrode 14. The conductive layer 16 is continuously formed over the ridge portion 12 and the bank portions 31 and is electrically connected to the p-side electrode 14.

In the present embodiment, an upper surface of the conductive layer 16 in the bank portions 31 and an upper surface of the solder material 20 formed on the submount 21 via the wiring pattern 23 are melted and adhered to form a semiconductor optical device. Here, since the upper surface of the conductive layer 16 on the bank portions 31 is higher in height than the upper surface of the conductive layer 16 on the ridge portion 12 by the thickness of the upper-bank patterns 15 formed below the conductive layer 16, the upper surface of the solder material 20 and the upper surface of the conductive layer 16 on the ridge portion 12 are separated with interposing a void therebetween and are not in contact with each other.

The manufacturing method of the laser diode according to the present embodiment will be described below in the order of process with reference to FIG. 2 to FIG. 9. Note that the process, material and film thickness to be described are shown by way of examples, and the present embodiment is not limited to these.

First, as shown in FIG. 2, the n-type clad layer 2 made of AlGaInP with a thickness of 1.8 μm is formed on the n-type GaAs substrate 1 by the MOCVD (Metal Organic Chemical Vapor Deposition) method. Subsequently, the optical confinement layer 3a made of non-doped AlGaInP, the strained quantum well layer 4a containing non-doped GaInP having a thickness of 5 nm, the barrier layer 5 made of non-doped AlGaInP having a thickness of 5 nm, the strained quantum well layer 4b containing non-doped GaInP having a thickness of 5 nm and the optical confinement layer 3b made of non-doped AlGaInP are sequentially deposited on the n-type clad layer 2 by the MOCVD method to form the multiple quantum well active layer 6 made up of these five layers.

Thereafter, the first p-type clad layer 7 made of p-type AlGaInP having a thickness of 0.3 µm, the etching stop layer 8 made of p-type GaInP having a thickness of 5 nm, the second p-type clad layer 9 made of p-type AlGaInP having a thickness of 1.2 µm and the contact layer 10 containing p-type GaAs are sequentially deposited on the multiple quantum well active layer 6 by the MOCVD method, thereby forming a double heterostructure.

Figure 3:
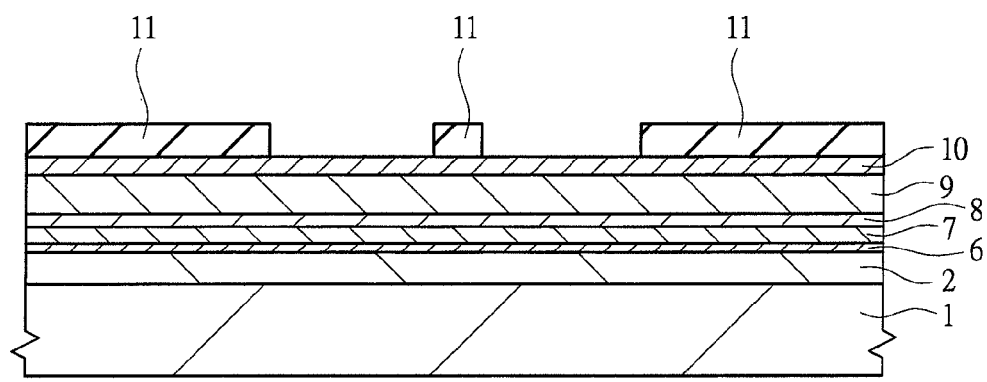
FIG. 3 is a cross-sectional view showing the principal part of the manufacturing method of the semiconductor optical device continued from FIG. 2.

Next, as shown in FIG. 3, after forming a silicon oxide film of 300 nm in thickness on the contact layer 10 by the MOCVD method, a part of the silicon oxide film is removed by the dry etching using a photoresist film (not shown) as a mask, thereby forming an insulating film 11 made up of the silicon oxide film left in the forming regions of the ridge portion and the bank portions. Then, the photoresist film on the insulating film 11 is removed by ashing.

Figure 4:
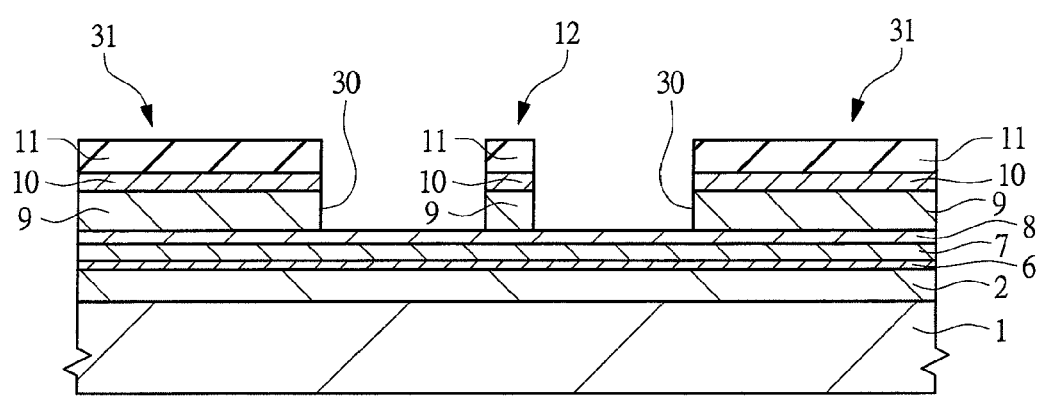
FIG. 4 is a cross-sectional view showing the principal part of the manufacturing method of the semiconductor optical device continued from FIG. 3.

Next, as shown in FIG. 4, the two trenches 30 are formed by removing a part of the contact layer 10 and the second p-type clad layer 9 by wet etching using the insulating film 11 as a mask, and the ridge portion 12 having the second p-type clad layer 9 and the contact layer 10 is formed between the two trenches 30. Note that the dry etching method with good controllability may be used for the formation of the ridge portion 12 instead of the wet etching. Also, the etching stop layer 8 may be made of a different material and the structure without the etching stop layer 8 itself is also possible.

Figure 5:
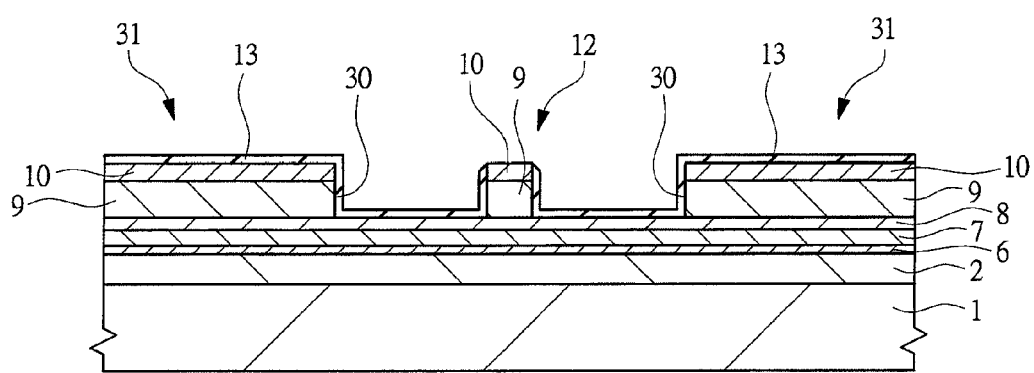
FIG. 5 is a cross-sectional view showing the principal part of the manufacturing method of the semiconductor optical device continued from FIG. 4.

Next, as shown in FIG. 5, after removing the insulating film 11 by the wet etching using hydrofluoric acid (HF) based etching solution, the silicon nitride film 13 to be a passivation film is deposited by the CVD (Chemical Vapor Deposition) method on the whole main surface of the GaAs substrate 1. Thereafter, the silicon nitride film 13 formed on the upper surface of the ridge portion 12 is selectively removed by the dry etching using the photolithography technology, thereby exposing the upper surface of the contact layer 10 in the upper part of the ridge portion 12. Here, the regions formed on the lateral sides of the ridge portion 12 with interposing the trenches 30 therebetween and each having the silicon nitride film 13 on their upper parts are referred to as the bank portions 31. Note that a silicon oxide film may be formed by the CVD method as an insulating film instead of the silicon nitride film 13.

Figure 6:
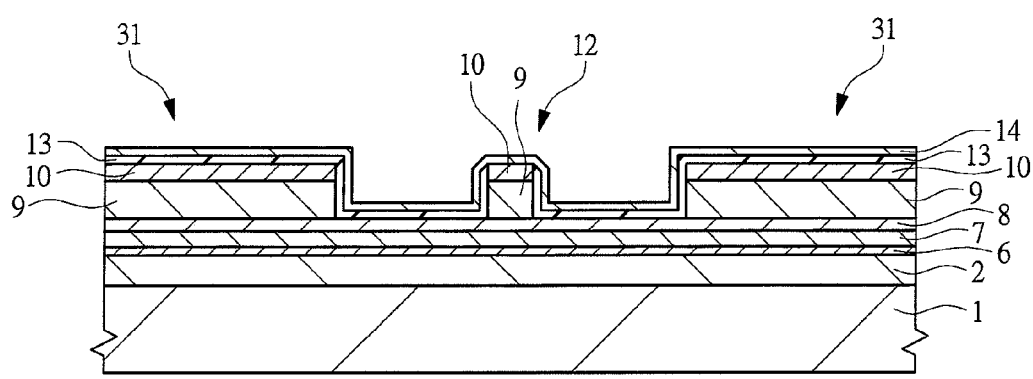
FIG. 6 is a cross-sectional view showing the principal part of the manufacturing method of the semiconductor optical device continued from FIG. 5.

Next, as shown in FIG. 6, the p-side electrode 14 made of Ti/Pt/Au having a thickness of about 0.5 µm is deposited by the electron beam (EB) deposition method or the like on the silicon nitride film 13 and on the upper surface of the exposed contact layer 10, and electrode patterns are formed by the photolithography technology and the dry etching technology. Here, the upper surface of the contact layer 10 and the p-side electrode 14 are electrically connected.

Figure 7:
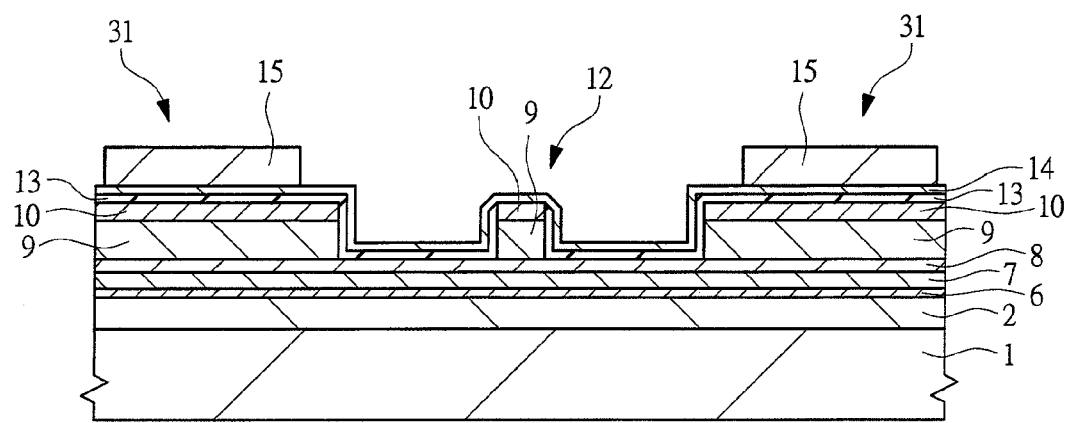
FIG. 7 is a cross-sectional view showing the principal part of the manufacturing method of the semiconductor optical device continued from FIG. 6.

Next, as shown in FIG. 7, the upper-bank patterns 15 to provide a difference in height from the upper part of the ridge portion 12 are formed on the upper surface of the p-side electrode 14 of the bunk portions 31. As the formation method of the upper-bank pattern 15, for example, after a photoresist is formed on the p-side electrode 14 except the upper surface of the bank portion 31, an Au plating film is selectively formed on the pattern portion not covered with the photoresist by electroplating, and then, the photoresist is removed. Note that the thickness of the upper-bank pattern 15 is set to 1.5 µm or larger. This is because the upper-bank patterns 15 are formed for the purpose of preventing the upper surface of the ridge portion 12 from being in contact with the solder material 20 formed on the submount 21.

Figure 8:
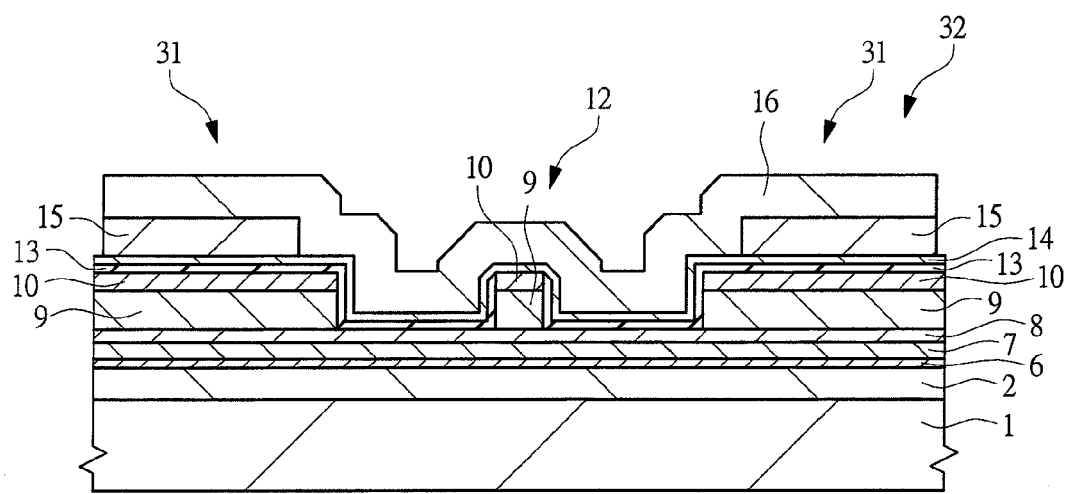
FIG. 8 is a cross-sectional view showing the principal part of the manufacturing method of the semiconductor optical device continued from FIG. 7.

Next, as shown in FIG. 8, an Au plating film is selectively deposited on the surface of the p-side electrode 14 and the surface of the upper-bank patterns 15 by the photolithography technology and the electroplating, thereby forming the conductive layer 16 which connects the ridge portion 12 and the bank portions 31.

Figure 9:
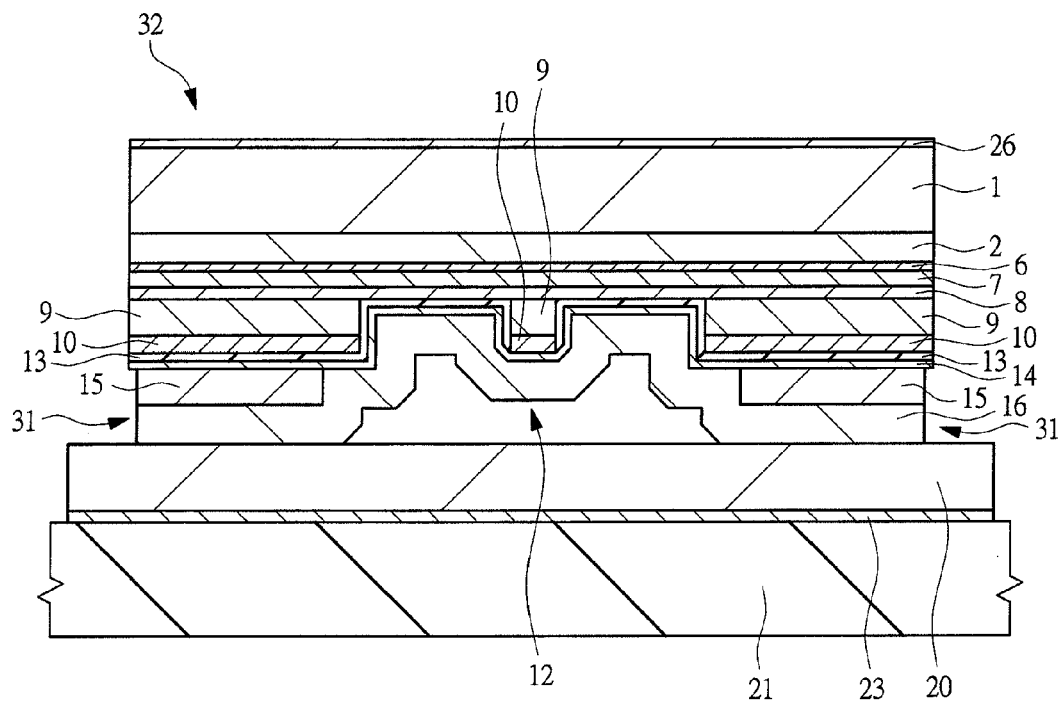
FIG. 9 is a cross-sectional view showing the principal part of the manufacturing method of the semiconductor optical device continued from FIG. 8.

Next, as shown in FIG. 9, the rear surface of the GaAs substrate 1 is polished until the thickness of the GaAs substrate 1 reaches 100 µm, and the n-side electrode 26 containing Au is deposited and formed on the rear surface of the GaAs substrate 1. Thereafter, the GaAs substrate 1 is cleaved and cut by the dicing into respective chips, thereby forming the laser chip 32. Then, the bonding surface of the laser chip 32 is directed downward, and the upper surface of the conductive layer 16 positioned on the upper-bank patterns 15 on the main surface side of the GaAs substrate 1 is bonded to the solder material 20 formed on the submount 21 via the wiring pattern 23.

Although the illustration of the subsequent process is omitted, the submount 21 is bonded onto the stem by the solder material 20. Thereafter, wire bonding for electrical conduction is provided to the n-side electrode, and the airtight sealing is made by using a cap having a glass window for transmitting the laser light. In this manner, the semiconductor optical device according to the present embodiment is completed. The typical components for the laser diode package may be used for the stem, cap, bonding wires and others.

Here, the solder material 20 contains AuSn, the submount 21 is made of AlN (aluminum nitride), and the wiring pattern 23 is made of Ti/Pt/Au. As shown in FIG. 9, on the upper surface of the laser chip 32, the upper surface of the conductive layer 16 on the bank portions 31 is higher in height than the upper surface of the conductive layer 16 on the ridge portion 12 by the thickness of the upper-bank patterns 15, so that the solder material 20 is not in contact with the conductive layer 16 on the ridge portion 12 and the solder material 20 and the ridge portion 12 are separated with interposing a void therebetween.

Here, in the conventional semiconductor optical device having a common laser diode, the conductive layer on the ridge portion is bonded to the solder material. Therefore, the stress generated due to the difference in thermal expansion coefficient of the electrode material on the ridge portion of the laser diode, the semiconductor material on the main surface of the laser diode, the solder material of the submount and the substrate material of the submount is applied to the ridge portion, and the polarization angle characteristics of the laser diode are deteriorated and the problem of the variation in the polarization angle occurs.

Figure 10:
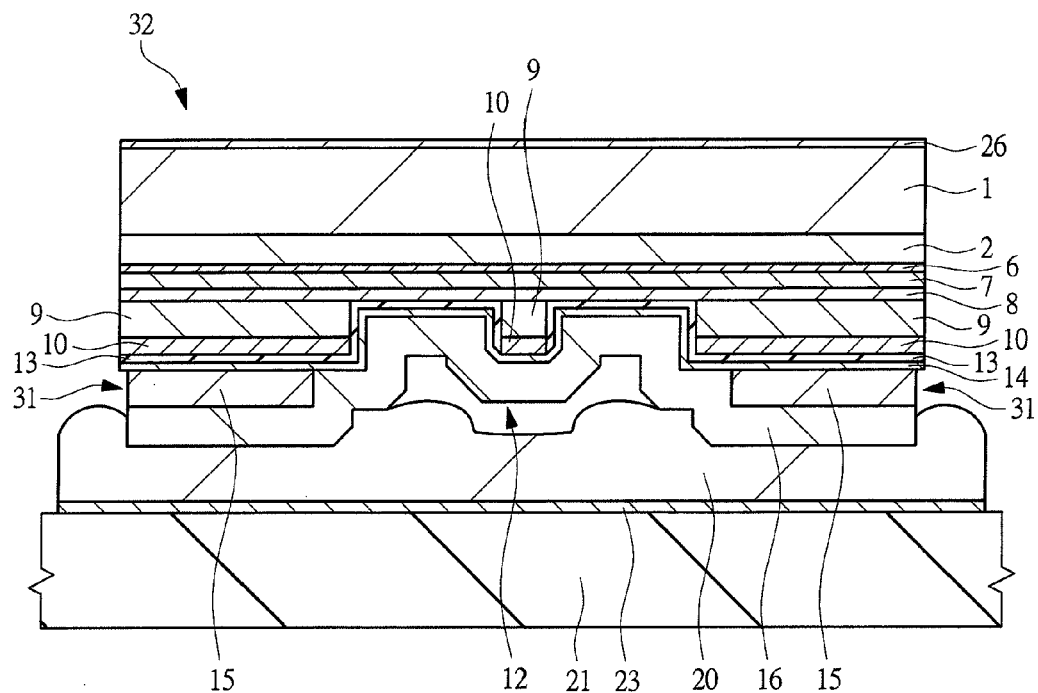
FIG. 10 is a cross-sectional view showing the principal part of the manufacturing method of the semiconductor optical device continued from FIG. 9.

Meanwhile, in the present embodiment, the ridge portion 12 positioned in the upper part of the light-emitting portion of the laser diode is not in contact with the solder material 20 on the side of the submount 21, the void is provided between the ridge portion 12 and the solder material 20 to separate them, and the ridge portion is separated from the bonding portion between the conductive layer 16 of the bank portions 31 and the solder material 20. In this manner, the transmission of the stress generated between the conductive layer 16 and the solder material 20 to the ridge portion 12 can be prevented, and the deterioration of the polarization angle characteristics can be prevented. Furthermore, as shown in FIG. 10, even in the case where apart of the solder material 20 protrudes toward the ridge portion 12 when bonding the laser chip 32 and the solder material 20, it is possible to prevent the deterioration in the polarization angle characteristics of the laser diode due to the contact of the solder material 20 and the ridge portion 12 and the reaction caused by the difference in thermal expansion coefficient between the ridge portion 12 and the solder material 20.

Furthermore, no complicated process is required for the formation of the steps for separating the ridge portion 12 and the solder material 20 in the present embodiment, and the steps can be easily formed by using existing technologies such as the plating technology and the photolithography technology through a small number of processes. Also, in the formation of the upper-bank patterns 15 and the conductive layer 16, the thickness thereof can be controlled with high accuracy by the plating technology, and therefore, the distance for separating the ridge portion 12 and the solder material 20 can be adjusted with high accuracy.

Furthermore, the upper-bank patterns 15 and the conductive layer 16 are formed by Au plating, and the conductive layer 16 is continuously formed over the ridge portion 12 and the bank portions 31. Therefore, the heat generated in the ridge portion 12 positioned in the upper part of the light-emitting portion is easily transmitted to the solder material 20, the wiring pattern 23 and the submount 21 through the upper-bank patterns 15 and the conductive layer 16, and the structure with good electrical conduction and heat dissipation can be achieved. Since the good heat dissipation can be ensured, the reduction in lifetime of the device can be prevented.

Also, in the present embodiment, the method in which the part of the solder material on the submount at the position to which the ridge portion is to be in contact is separated to achieve a noncontact state is not employed, and therefore, it is not necessary to align the position of the upper part of the ridge portion of the laser diode chip with the position of the part separated from the solder material when assembling the laser diode chip to the submount, and the assembly equipment is not required to have the high positional accuracy.

Note that the single beam laser diode having one light-emitting portion has been described in the present embodiment, but the present invention can be applied to the array laser diode having plural light-emitting portions.

Second Embodiment

In the first embodiment, the manufacturing process of the semiconductor optical device in which the conductive layer is deposited on the upper-bank pattern in the bank portion has been described. In the present embodiment, a laser diode in which the upper-bank pattern is formed on the conductive layer will be described.

The manufacturing method of the laser diode according to the present embodiment will be described in the order of process with reference to FIG. 11 to FIG. 13.

First, the same process as that of the first embodiment shown in FIG. 2 to FIG. 6. is performed. More specifically, after forming the n-type clad layer 2 on the GaAs substrate 1, the multiple quantum well active layer 6 including the optical confinement layer, the strained quantum well layer and the barrier layer is formed on the n-type clad layer 2, and then, the first p-type clad layer 7, the etching stop layer 8, the second p-type clad layer 9 and the contact layer 10 are sequentially formed on the multiple quantum well active layer 6.

Next, after depositing a silicon oxide film of 100 nm in thickness on the contact layer 10, an insulating film made up of the silicon oxide film is formed in the forming regions of the ridge portion and the bank portions by the photolithography technology, and the two trenches 30 are formed and the ridge portion 12 is formed between the trenches 30 by the wet etching using the insulating film as a mask.

Next, after removing the insulating film, the silicon nitride film 13 is deposited on the whole main surface of the GaAs substrate 1, and the silicon nitride film 13 formed on the upper surface of the ridge portion 12 is selectively removed, thereby exposing the upper surface of the contact layer 10 in the upper part of the ridge portion 12. Thereafter, the p-side electrode 14 made of Ti/Pt/Au is deposited on the upper surface of the silicon nitride film 13, the upper surface of the exposed contact layer 10 and the inner wall of the trenches 30, and the electrode pattern is formed by the photolithography technology and the dry etching technology. Here, the regions formed on the lateral sides of the ridge portion 12 with interposing the trenches 30 therebetween and each having the silicon nitride film 13 in their upper parts are referred to as the bank portions 31.

Figure 11:
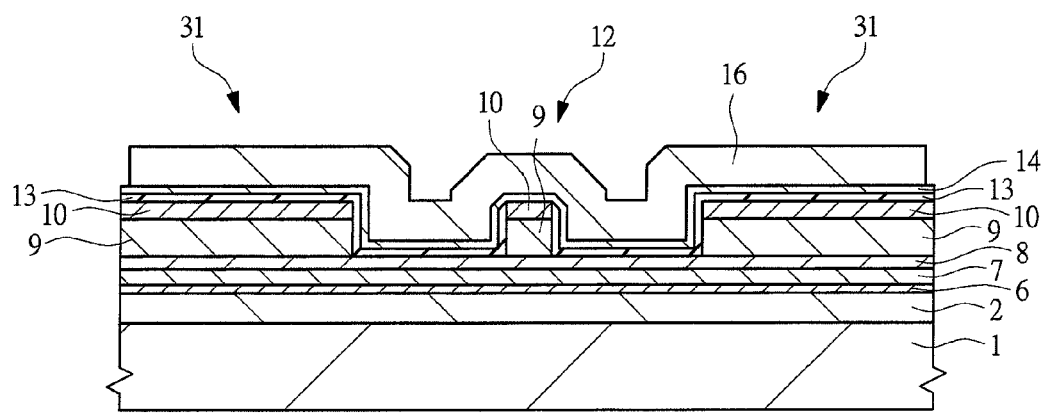
FIG. 11 is a cross-sectional view showing the principal part of the manufacturing method of the semiconductor optical device according to the second embodiment of the present invention.

Next, as shown in FIG. 11, the conductive layer 16 is formed on the p-side electrode 14 by the photolithography technology and the electroplating. The conductive layer 16 is selectively formed on, for example, the pattern formed by the photoresist, that is, in the region from the bank portions 31 to the ridge portion 12.

Figure 12:
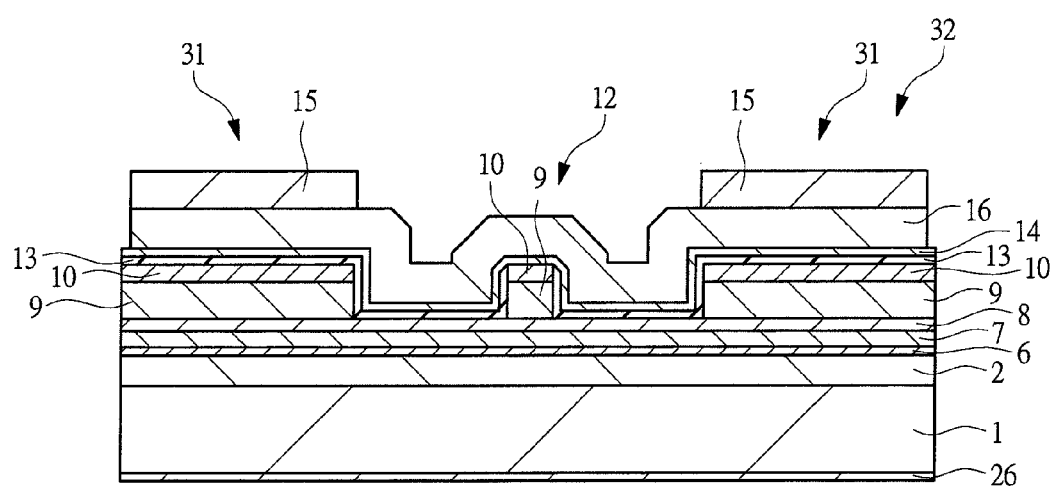
FIG. 12 is a cross-sectional view showing the principal part of the manufacturing method of the semiconductor optical device continued from FIG. 11.

Next, as shown in FIG. 12, the upper-bank patterns 15 in contact with the conductive layer 16 are selectively formed by the same method as the formation of the conductive layer. Thereafter, the rear surface of the GaAs substrate 1 is polished until the thickness of the GaAs substrate 1 reaches 100 μm, and the n-side electrode 26 containing Au is deposited and formed on the rear surface of the GaAs substrate 1. Then, the GaAs substrate 1 is cleaved and cut by the dicing into respective chips, thereby forming the laser chip 32.

Figure 13:
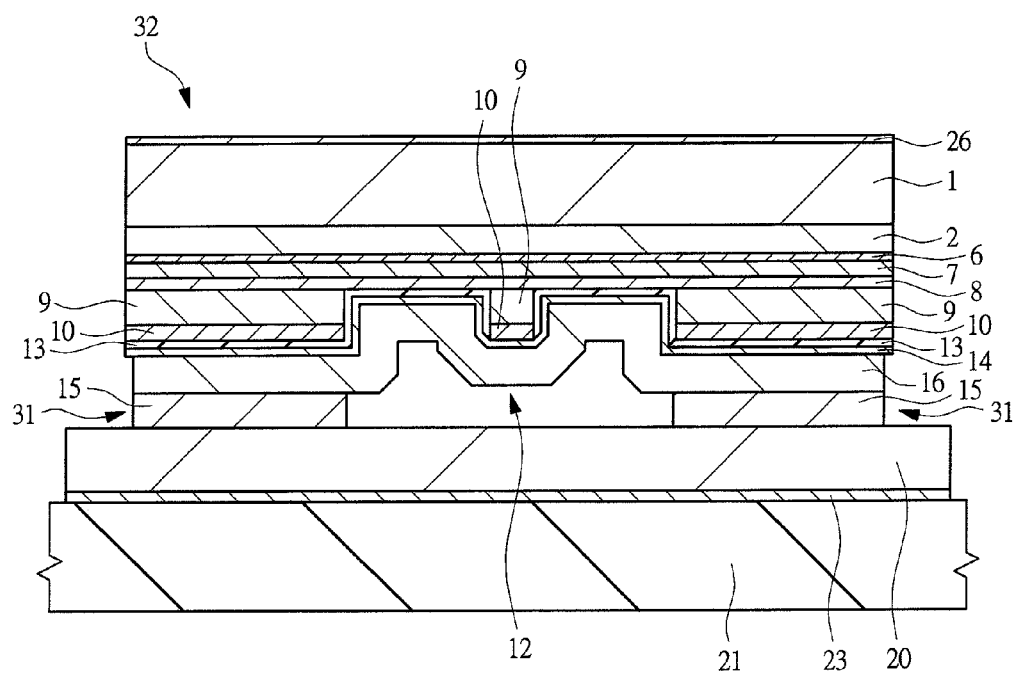
FIG. 13 is a cross-sectional view showing the principal part of the manufacturing method of the semiconductor optical device continued from FIG. 12.

Next, as shown in FIG. 13, the bonding surface of the laser chip 32 is directed downward, and the upper surfaces of the upper-bank patterns 15 of the bank portions 31 on the main surface side of the GaAs substrate 1 are bonded to the solder material 20 formed on the submount 21 via the wiring pattern 23. In this manner, the semiconductor optical device according to the present embodiment is completed. Note that the solder material 20 contains AuSn, the submount 21 is made of AlN, and the wiring pattern 23 is made of Ti/Pt/Au. At this time, on the upper surface of the laser chip 32, the upper surface of the bank portions 31 is higher in height than the upper surface of the conductive layer 16 on the ridge portion 12 by the thickness of the upper-bank patterns 15, so that the solder material 20 is not in contact with the conductive layer 16 on the ridge portion 12 and the solder material 20 and the ridge portion 12 are separated with interposing a void therebetween.

In the present embodiment, since the conductive layer 16 and the upper-bank patterns 15 made of metal films which are good in heat and electrical conduction and whose thickness can be controlled with high accuracy are formed in the bank portions 31 to separate the solder material 20 and the ridge portion 12, the same effect as the first embodiment can be achieved.

Third Embodiment

In the present embodiment, the manufacturing process of the semiconductor optical device in which the material of the upper-bank pattern is changed to an insulator and the p-side electrode is deposited and formed after forming the upper-bank pattern will be described.

The manufacturing method of the laser diode according to the present embodiment will be described in the order of process with reference to FIG. 14 to FIG. 16.

First, the same process as that of the first embodiment shown in FIG. 2 to FIG. 4. is performed. More specifically, after forming the n-type clad layer 2 on the GaAs substrate 1, the multiple quantum well active layer 6 including the optical confinement layer, the strained quantum well layer and the barrier layer is formed on the n-type clad layer 2, and then, the first p-type clad layer 7, the etching stop layer 8, the second p-type clad layer 9 and the contact layer 10 are sequentially formed on the multiple quantum well active layer 6.

Thereafter, after depositing a silicon oxide film of 300 nm in thickness on the contact layer 10, the insulating film 11 made up of the silicon oxide film is formed in the forming regions of the ridge portion and the bank portions by the photolithography technology, and the two trenches 30 are formed and the ridge portion 12 is formed between the trenches 30 by the wet etching using the insulating film 11 as a mask.

Figure 14:
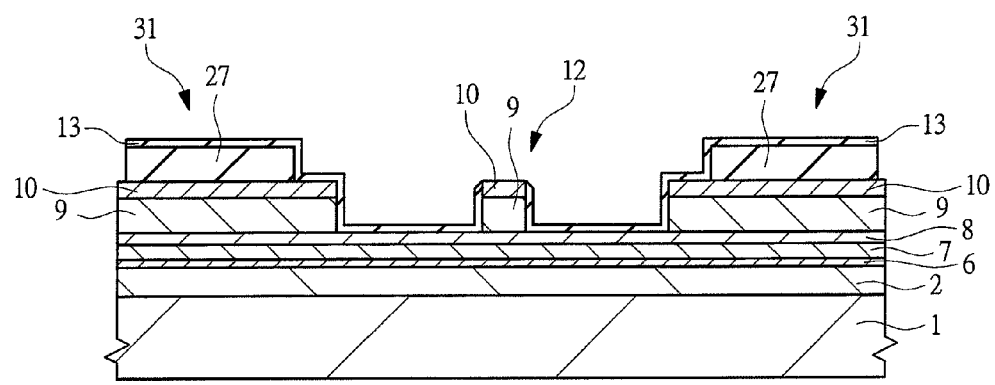
FIG. 14 is a cross-sectional view showing the principal part of the manufacturing method of the semiconductor optical device according to the third embodiment of the present invention.

Next, as shown in FIG. 14, after removing the insulating film 11, a silicon nitride film is deposited on the whole main surface of the GaAs substrate 1 by the CVD method, and upper-bank patterns 27 made up of the silicon nitride film are selectively formed by the photolithography technology and the wet etching. Note that the material of the upper-bank pattern 27 may be silicon oxide or PSG (Phospho Silicate Glasses)-SiO$_2$ or the like. Thereafter, after the silicon nitride film 13 is deposited on the whole main surface of the GaAs substrate 1 by the CVD method, the silicon nitride film 13 formed on the upper surface of the ridge portion 12 is selectively removed, thereby exposing the upper surface of the contact layer 10 in the upper part of the ridge portion 12.

Figure 15:
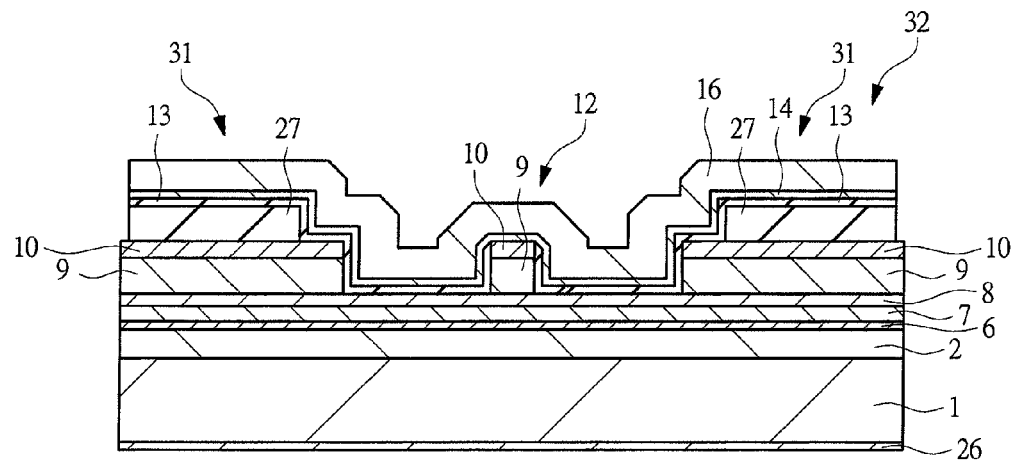
FIG. 15 is a cross-sectional view showing the principal part of the manufacturing method of the semiconductor optical device continued from FIG. 14.

Next, as shown in FIG. 15, after the p-side electrode 14 made of Ti/Pt/Au is formed on the silicon nitride film 13 to form the pattern, the conductive layer 16 is formed on the p-side electrode 14 by the photolithography technology and the electroplating.

Then, the rear surface of the GaAs substrate 1 is polished until the thickness of the GaAs substrate 1 reaches 100 μm, and the n-side electrode 26 containing Au is deposited and formed on the rear surface of the GaAs substrate 1. Thereafter, the GaAs substrate 1 is cleaved and cut by the dicing into respective chips, thereby forming the laser chip 32.

Figure 16:
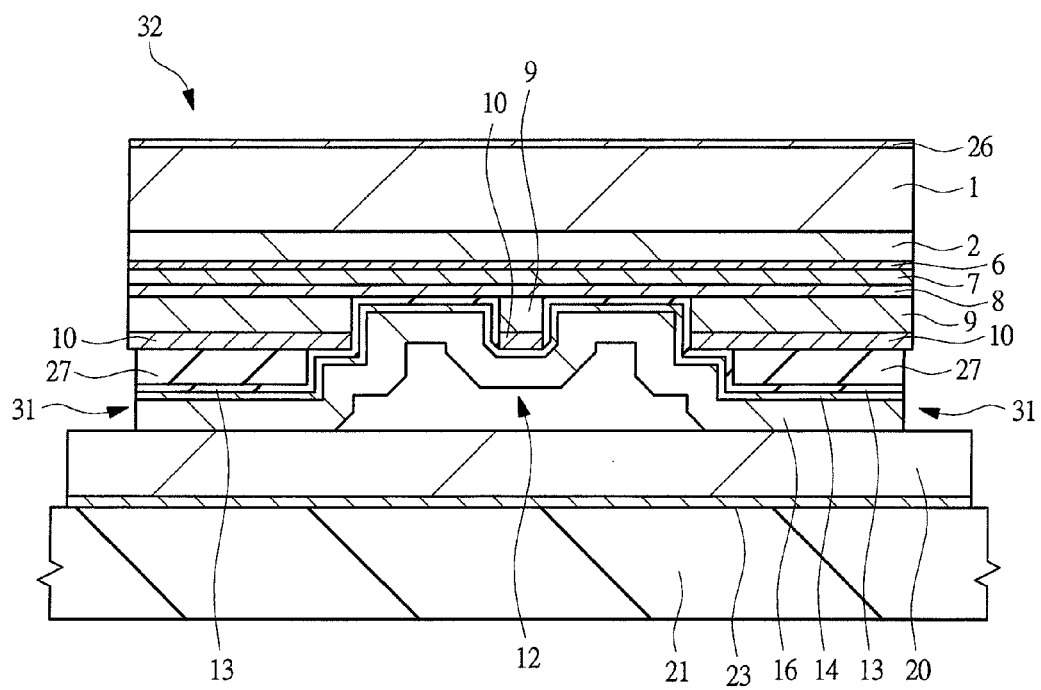
FIG. 16 is a cross-sectional view showing the principal part of the manufacturing method of the semiconductor optical device continued from FIG. 15.

Next, as shown in FIG. 16, the bonding surface of the laser chip 32 is directed downward, and the upper surface of the conductive layer 16 of the bank portions 31 on the main surface side of the GaAs substrate 1 is bonded to the solder material 20 formed on the submount 21 via the wiring pattern 23. In this manner, the semiconductor optical device according to the present embodiment is completed.

Note that the solder material 20 contains AuSn, the submount 21 is made of AlN, and the wiring pattern 23 is made of Ti/Pt/Au. At this time, on the upper surface of the laser chip 32, the upper surfaces of the bank portions 31 are higher in height than the upper surface of the conductive layer 16 on the ridge portion 12 by the thickness of the upper-bank patterns 27, so that the solder material 20 is not in contact with the conductive layer 16 on the ridge portion 12 and the solder material 20 and the ridge portion 12 are separated with interposing a void therebetween.

In the present embodiment, the ridge portion 12 positioned in the upper part of the light-emitting portion of the laser diode is not in contact with the solder material 20 on the side of the submount 21, the void is provided between the ridge portion 12 and the solder material 20 to separate them, and the ridge portion 12 is separated from the bonding portion between the conductive layer 16 of the bank portions 31 and the solder material 20. In this manner, it is possible to prevent the deterioration of the polarization angle characteristics due to the transmission of the stress generated each between the electrode material on the ridge portion of the laser diode, the semiconductor material on the main surface of the laser diode, the solder material of the submount and the substrate material of the submount to the ridge portion 12. Furthermore, similarly to the first embodiment described above, since the ridge portion 12 and the solder material 20 are separated, even in the case where the solder material 20 protrudes when bonding the laser chip 32 and the solder material 20, it is possible to prevent the deterioration in the polarization angle characteristics of the laser diode due to the contact of the solder material 20 and the ridge portion 12 and the reaction caused by the difference in thermal expansion coefficient between the ridge portion 12 and the solder material 20.

Furthermore, no complicated process is required for the formation of the steps for separating the ridge portion 12 and the solder material 20, and the steps can be easily formed by using existing technologies such as the plating technology and the photolithography technology through a small number of processes. Also, in the formation of the upper-bank patterns 27 and the conductive layer 16, the thickness thereof can be controlled with high accuracy by the plating technology, and therefore, the distance for separating the ridge portion 12 and the solder material 20 can be adjusted with high accuracy.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor optical device according to the present invention can be widely used for the semiconductor optical device having a laser diode.

What is claimed is:

1. A semiconductor optical device in which a semiconductor substrate having a laser diode formed thereon is bonded to a submount by a junction-down method, wherein the laser diode includes:
   a clad layer of a first conductivity type formed on a main surface of the semiconductor substrate;
   an active layer formed on an upper surface of the clad layer of the first conductivity type;
   a clad layer of a second conductivity type formed on the active layer;
   a ridge portion including portions of the clad layer of the second conductivity type;
   bank portions each including portions of the clad layer of the second conductivity type and formed on lateral sides of the ridge portion;
   a first electrode electrically connected to the ridge portion and continuously formed from an upper part of the ridge portion to upper parts of the bank portions;
   upper-bank patterns formed on the upper parts of the bank portions;
   a conductive layer formed over the upper-bank patterns and over an upper surface of the first electrode in the upper part of the ridge portion such that the upper-bank patterns are positioned between the first electrode and the conductive layer; and
   a second electrode formed on a rear surface of the semiconductor substrate;
   upper surfaces of the bank portions including portions of the first electrode;
   upper surfaces of the conductive layer in the bank portions being bonded by solder to an upper surface of a third electrode formed on the submount;

the upper surfaces of the bank portions being higher in height than the upper surface of the first electrode in the upper part of the ridge portion, and the surface of the first electrode in the upper part of the ridge portion is separated from the surface of the third electrode on the submount and is not bonded to the third electrode by the solder.

2. The semiconductor optical device according to claim 1, wherein the upper-bank patterns have a thickness of 1.5 μm or larger.

3. The semiconductor optical device according to claim 1, wherein the upper-bank patterns include gold, silicon oxide or silicon nitride.

4. The semiconductor optical device according to claim 1, wherein the upper-bank patterns are formed below the first electrode or formed to be in contact with the upper surface of the first electrode.

5. The semiconductor optical device according to claim 1, wherein the solder is a AuSn solder.

6. A semiconductor optical device in which a semiconductor substrate having a laser diode formed thereon is bonded to a submount by a junction-down method, wherein the laser diode includes:
a clad layer of a first conductivity type formed on a main surface of the semiconductor substrate;
an active layer formed on an upper surface of the clad layer of the first conductivity type;
a clad layer of a second conductivity type formed on the active layer;
a ridge portion including portions of the clad layer of the second conductivity type;
bank portions each including portions of the clad layer of the second conductivity type and formed on lateral sides of the ridge portion;
a first electrode electrically connected to the ridge portion and continuously formed from an upper part of the ridge portion to upper parts of the bank portions;
upper-bank patterns formed on the upper parts of the bank portions;
a conductive layer formed over the upper-bank patterns and over an upper surface of the first electrode in the upper part of the ridge portion such that the upper-bank patterns are positioned between the first electrode and the conductive layer; and
a second electrode formed on a rear surface of the semiconductor substrate;
upper surfaces of the bank portions including portions of the first electrode;
upper surfaces of the conductive layer in the bank portions being bonded by solder to an upper surface of a third electrode formed on the submount;
the upper surfaces of the bank portions being higher in height than the upper surface of the first electrode in the upper part of the ridge portion; and
the surface of the first electrode in the upper part of the ridge portion is separated from the surface of the third electrode on the submount with a void being disposed therebetween.

7. The semiconductor optical device according to claim 6, wherein the upper-bank patterns have a thickness of 1.5 μm or larger.

8. The semiconductor optical device according to claim 6, wherein the upper-bank patterns include gold, silicon oxide or silicon nitride.

9. The semiconductor optical device according to claim 6, wherein the upper-bank patterns are formed below the first electrode or formed to be in contact with the upper surface of the first electrode.

10. The semiconductor optical device according to claim 6, wherein the solder is a AuSn solder.

* * * * *